United States Patent
Mikami et al.

(10) Patent No.: US 7,915,657 B2
(45) Date of Patent: Mar. 29, 2011

(54) SEMICONDUCTOR INTEGRATED CIRCUIT

(75) Inventors: Nobukazu Mikami, Saitama (JP); Hiroki Usui, Kanagawa (JP); Takuya Nakauchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/654,615

(22) Filed: Dec. 24, 2009

(65) Prior Publication Data

US 2010/0188118 A1 Jul. 29, 2010

(30) Foreign Application Priority Data

Jan. 23, 2009 (JP) .................. 2009-012949

(51) Int. Cl.
*H01L 21/8234* (2006.01)
*G11C 11/22* (2006.01)
(52) U.S. Cl. ........ 257/296; 257/349; 257/369; 438/275; 438/294; 438/396; 365/145; 365/154; 365/190; 326/14
(58) Field of Classification Search .................. 257/296, 257/349, 369, 365, 371, 394, 401; 438/275, 438/294, 396; 326/9–15; 327/208, 218; 365/145, 154, 190
See application file for complete search history.

(56) References Cited

U.S. PATENT DOCUMENTS

| | | | | |
|---|---|---|---|---|
| 6,583,470 | B1 * | 6/2003 | Maki et al. | 257/349 |
| 7,142,004 | B2 * | 11/2006 | Calrson | 326/14 |
| 7,638,849 | B2 * | 12/2009 | Furuta et al. | 257/365 |
| 7,808,056 | B2 * | 10/2010 | Furuta et al. | 257/401 |
| 2006/0275995 | A1 * | 12/2006 | Furuta | 438/396 |
| 2007/0141794 | A1 * | 6/2007 | Morris | 438/294 |
| 2008/0142899 | A1 * | 6/2008 | Morris et al. | 257/371 |

FOREIGN PATENT DOCUMENTS

JP    2007-073709    3/2007

* cited by examiner

*Primary Examiner* — Vibol Tan
(74) *Attorney, Agent, or Firm* — Rader, Fishman & Grauer PLLC

(57) ABSTRACT

Disclosed herein is a semiconductor integrated circuit including: a memory circuit section used for storing data; and a non-memory circuit section which is provided to serve as a section other than the memory circuit section and used for storing no data, wherein the second-conduction-type impurity concentration of a second-conduction-type semiconductor area including a channel created for a first-conduction-type transistor employed in the non-memory circuit section is lower than the second-conduction-type impurity concentration of a second-conduction-type semiconductor area including a channel created for a first-conduction-type transistor employed in the memory circuit section.

9 Claims, 11 Drawing Sheets

INCIDENCE OF RADIATED LIGHT

VOLTAGE DROP

LOGIC INVERSION

WITHOUT
COUNTERMEASURE
(NORMAL STATE)

WITH
COUNTERMEASURE (202B=202B1+202B2)

SEMICONDUCTOR INTEGRATED CIRCUIT

BACKGROUND OF THE INVENTION

1. Field of the Invention

The present invention relates to a semiconductor integrated circuit which has a memory circuit section and a non-memory circuit section.

2. Description of the Related Art

Accompanying miniaturization of the LSI (Large Scale Integration), the functions of the LSI are made more advanced, the integration scale of the LSI is increased and the power consumption of the LSI is reduced. Due to particularly a smaller amount of signal charge caused by a lower power-supply voltage, however, a sensitivity exhibited by the LSI as a sensitivity to radiated light increases. It is thus feared that the probability of soft-error generation caused by radiated light dramatically increases.

Normally, soft-error generation caused by radiated light raises a problem that data stored in a storage device such as a DRAM (Dynamic Random Access Memory) or an SRAM (Static Random Access Memory) is undesirably lost from the storage device when the radiated light hits the storage device. Stored data lost from a storage device is an accidental fault referred to an SEU (Single Event Upset).

In the event of a fault of this kind, the storage device itself is not damaged. Instead, data stored in a storage device is damaged and lost. The technical term 'soft error' is deliberately used in order to distinguish this soft error from a hard error which is attributed to a failure occurring in a device.

At the present day, in the case of a device whose reliability is important, an error avoidance technology at a circuit level is used as a countermeasure against an SEU. Examples of the device whose reliability is of importance are an LSI and a semiconductor circuit. A typical example of the error avoidance technology is an ECC (Error Checking and Correction) technology which makes use of an error detection code such as a parity bit.

As the operating voltage of a storage device becomes lower to accompany the progress in miniaturization of the storage device, the probability of the generation of a soft error increases. Thus, in the future, a countermeasure against the generation of a soft error is mandatory.

If an ECC circuit for encoding and decoding an error detection code such as a parity bit is added, however, the area of the LSI increases and an access speed is inevitably sacrificed due to comparisons which need to be made from time to time. In addition, generation of an SET (Single Event Transient) can no longer be ignored. The SET is a soft error generated in a logic circuit device which is other than the storage device cited above.

On top of that, unlike the storage device, in order to prevent an SET from occurring in a logic circuit device, it is impossible to have the logic circuit device designed to adopt an error avoidance technique based on an ECC circuit making use of parity bits or the like.

Thus, in order to prevent an SET from occurring in a logic circuit, there is no other choice than making the logic circuit redundant. In this case, a logic value output by an additional circuit required to make up the logic circuit must be compared from time to time with a logic value output by the original logic circuit.

In order to make the logic circuit redundant and compare a logic value output by an additional circuit required to make up the logic circuit with a logic value output by the original logic circuit from time to time, two to three original main logic circuits must be created. In addition, it is also necessary to prepare a circuit for the comparison purpose separately from the two to three original main logic circuits.

Thus, the area of the chip of the logic circuit device increases inevitably and the cost of manufacturing the chip also undesirably rises in a single burst. As a result, the power consumption becomes higher undesirably as well and the from-time-to-time comparisons also unavoidably deteriorate the performance of the logic circuit device.

For the reasons described above, if an LSI required to exhibit a high-reliability characteristic is provided with a technique of making the logic circuit redundant and comparing a logic value output by an additional circuit required to make up the logic circuit with a logic value output by the original logic circuit from time to time, the increased area of the chip of the LSI undesirably cancels aforementioned merits given by the miniaturization.

In addition, in the case of an LSI not much required to exhibit such a high-reliability characteristic, it is quite within the bounds of possibility that, as the miniaturization makes further progress, an unresolved problem caused by the further progress can no longer be tolerated in the applications of such an LSI. In such a case, the higher performance and the lower manufacturing cost which are results of the miniaturization of the LSI will be limited by a neck formed by the countermeasures against soft errors caused by radiated light.

As described above, a limit is imposed on the method for avoiding a soft error at the circuit level. Thus, in order to further reduce the manufacturing cost and the power consumption as a result of miniaturization, it is necessary to take a countermeasure for avoiding soft errors at the device level.

A SET countermeasure technology established by changing the pattern of a transistor is disclosed in documents such as Japanese Patent Laid-open No. 2007-073709.

SUMMARY OF THE INVENTION

In some cases, effects obtained by changing the pattern of a transistor are also limited. It is thus necessary to take an effective countermeasure at the device level.

Inventors of the present invention have innovated a semiconductor integrated circuit taking a countermeasure that is particularly capable of effectively avoiding SETs.

A semiconductor integrated circuit a according to an embodiment of the present invention employs a memory circuit section used for storing data and a non-memory circuit section which is provided to serve as a section other than the memory circuit section and used for storing no data.

In the semiconductor integrated circuit, the second-conduction-type impurity concentration of a second-conduction-type semiconductor area including a channel created for a first-conduction-type transistor employed in the non-memory circuit section is lower than the second-conduction-type impurity concentration of a second-conduction-type semiconductor area including a channel created for a first-conduction-type transistor employed in the memory circuit section.

In a configuration of the non-memory circuit section according to another embodiment, the non-memory circuit section includes a combinational logic circuit and a sequential logic circuit. In such a configuration, the second-conduction-type impurity concentration of a second-conduction-type semiconductor area of the combinational logic circuit is reduced to a level lower than those of the memory circuit section and the sequential logic circuit.

In another configuration of the non-memory circuit section according to further embodiment, the non-memory circuit section includes a flip-flop circuit and a clock generating circuit configured to supply a clock signal to the flip-flop circuit. In such a configuration, the second-conduction-type impurity concentration of a second-conduction-type semiconductor area of the clock generating circuit is reduced to a level lower than those of the memory circuit section and the flip-flop circuit.

In a further configuration of the non-memory circuit section according to still further embodiment, the non-memory circuit section includes a flip-flop circuit, a clock generating circuit and a control-signal generating circuit configured to supply at least one of a clear signal and a preset signal to the flip-flop circuit. In such a configuration, the second-conduction-type impurity concentration of a second-conduction-type semiconductor area of the control-signal generating circuit and the second-conduction-type impurity concentration of a second-conduction-type semiconductor area of the clock generating circuit are reduced to a level lower than those of the memory circuit section and the flip-flop circuit.

The clock generating circuit includes a buffer circuit configured to form the waveform of the clock signal generated by the clock generating circuit. By the same token, the control-signal generating circuit includes a buffer circuit configured to form the waveforms of the clear signal and/or the preset signal which are generated by the control-signal generating circuit. In this case, it is nice to reduce the second-conduction-type impurity concentration of a second-conduction-type semiconductor area including a channel created for a first-conduction-type transistor employed in at least the buffer circuit to a level lower than those of the memory circuit section and the flip-flop circuit.

In the configuration described above, when radiated light hits the semiconductor integrated circuit, a large number of electrons and a large number of holes are generated. For example, let the first-conduction-type transistor be an N-channel-type transistor and the second-conduction type be the P type.

In this case, in particular, on the drain side having a high electric potential, the generated electrons are about to lower the electric potential of the drain. However, an electric potential appearing at the base of a parasitic bipolar transistor existing in the N-channel-type transistor rises due to accumulation of the holes generated by the incidence of the radiated light. It is to be noted that the base of the parasitic bipolar transistor is a second-conduction-type impurity area of the second-conduction-type semiconductor area including a channel created for the transistor whereas the second-conductivity type is the P type in the case of this embodiment as described above. Since the impurity concentration in the P-type impurity area is relatively low at that time, the parasitic bipolar transistor enters a turned-on state with ease. Thus, before a large number of electrons generated by the incidence of the radiated light are collected at the drain and lower the electric potential of the drain, the electrons are immediately expelled to the source side by the parasitic bipolar transistor which has entered a turned-on state.

It is thus possible to provide a semiconductor integrated circuit taking a countermeasure that is particularly capable of effectively avoiding SETs.

BRIEF DESCRIPTION OF THE DRAWINGS

These and other innovations as well as features of the present invention will become clear from the following description of preferred embodiments given with reference to the accompanying diagrams, in which.

DETAILED DESCRIPTION OF THE PREFERRED EMBODIMENTS

Preferred embodiments of the invention are described below by referring to the above diagrams in chapters which are arranged as follows:

1. First Embodiment

This chapter describes a semiconductor integrated circuit which employs an SRAM block serving as a memory circuit section and a logic circuit block serving as a non-memory circuit section.

2. Second Embodiment

This chapter describes a second embodiment obtained from the first embodiment by dividing the non-memory circuit section into a sequential logic circuit and a combinational logic circuit and by taking only the combinational logic circuit to serve as a circuit portion having a relatively low channel-area concentration.

3. Third Embodiment

This chapter describes a third embodiment obtained from the second embodiment by dividing the combinational logic circuit into a logic processing portion and a signal generating portion and by taking only the signal generating portion to serve as a circuit portion having a relatively low channel-area concentration. The signal generating portion is a section for providing flip-flop circuits employed in the sequential logic circuit with a clock signal and a variety of control signals asynchronous with data stored in the flip-flop circuits.

4. Modified Versions

1. First Embodiment

A soft error is an error caused by radiated light incident to a semiconductor device composing an LSI. The radiated light causes a large noise current to instantaneously flow, inverting logic in the circuit of the LSI. As a result, the soft error inevitably causes an incorrect output to be generated or undesirably causes an unexpected operation to be carried out.

The following description distinguishes a soft error generated in a memory circuit section serving as a semiconductor device portion used for storing data from a soft error generated in a non-memory circuit section serving as a semiconductor device portion used for storing no data but used for transferring data. In the following description, a soft error generated in a memory circuit section is referred to as an SEU (Single Event Upset). On the other hand, a soft error generated in a non-memory circuit section is referred to as an SET (Single Event Transient).

Figure 1:
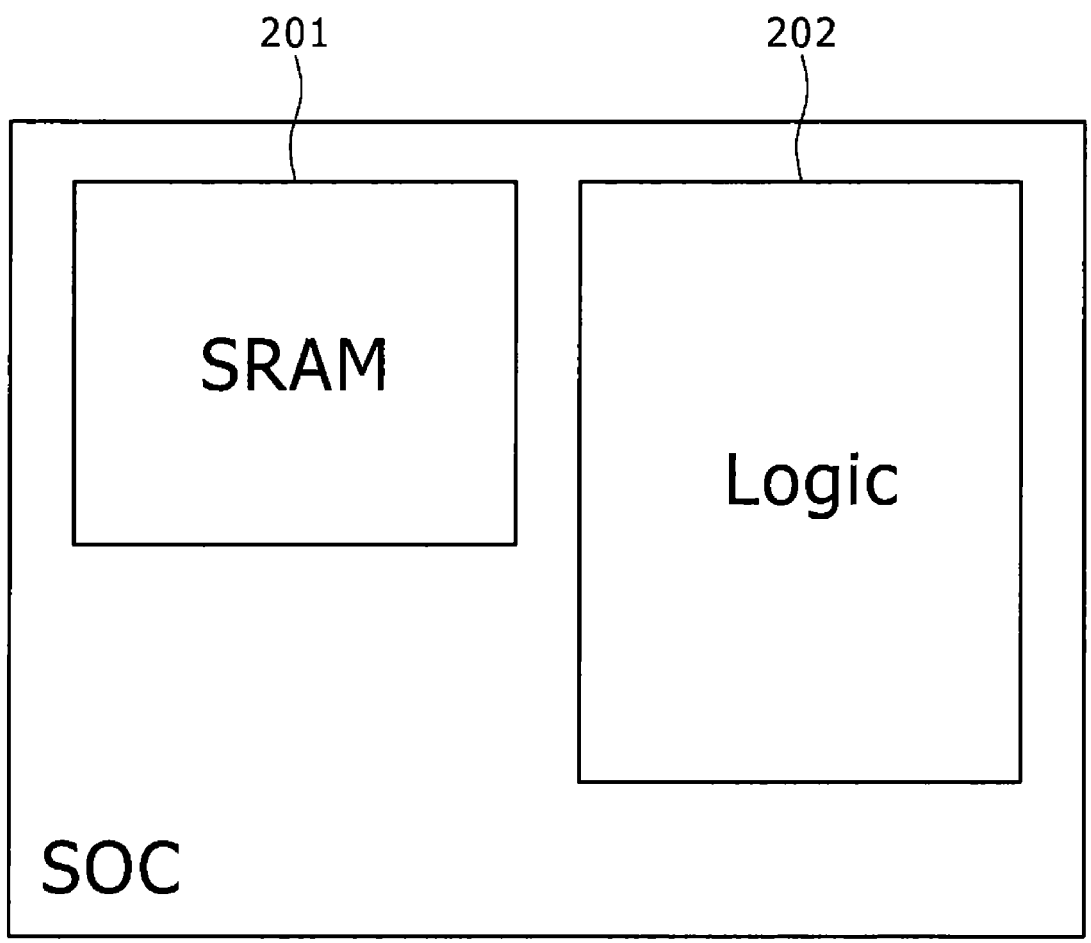
FIG. 1 is a rough block diagram showing a semiconductor integrated circuit according to a first embodiment.

FIG. 1 is a rough block diagram showing a semiconductor integrated circuit 200A according to a first embodiment.

The semiconductor integrated circuit 200A shown in the block diagram of FIG. 1 has an SOC (System On Silicon) chip configuration. As shown in the block diagram of FIG. 1, the SOC chip generally includes an SRAM block 201 serving as a memory circuit section and a logic circuit block 202 serving as a non-memory circuit section.

The SRAM block 201 includes a memory-cell array composed of a number of SRAM cells laid out to form a matrix and a peripheral circuit for controlling the operation of the memory-cell array. However, this configuration of the SRAM block 201 is not shown in any of the figures in particular. An SEU is generated inside the SRAM block 201, particularly, inside the memory-cell array. It is thus feared that data stored in the SRAM block 201 is damaged by the generated SEU.

Figure 2A:
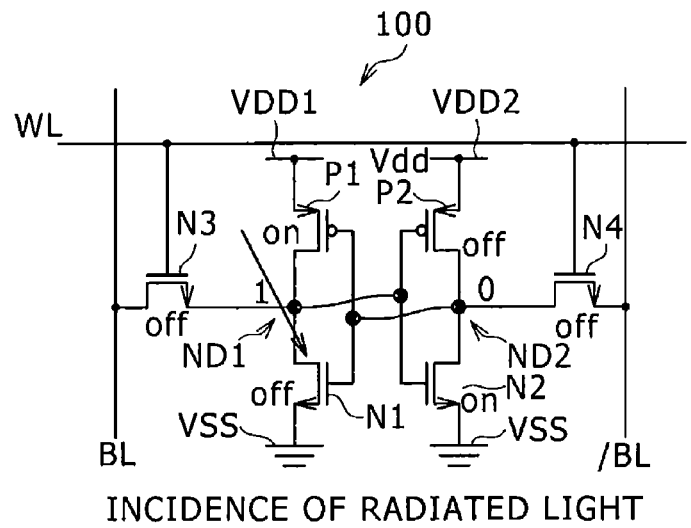
FIGS. 2A to 2C are a plurality of explanatory circuit diagrams each showing a typical configuration of an SRAM cell carrying out an operation in which an error is generated due to incidence of radiated light.
Figure 2B:
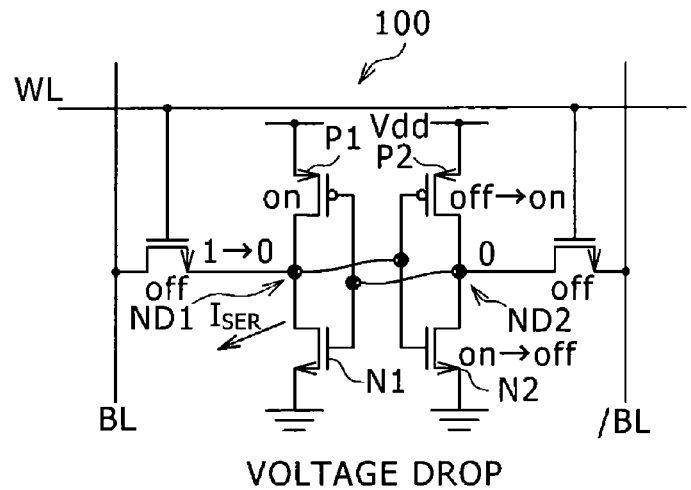
Figure 2C:
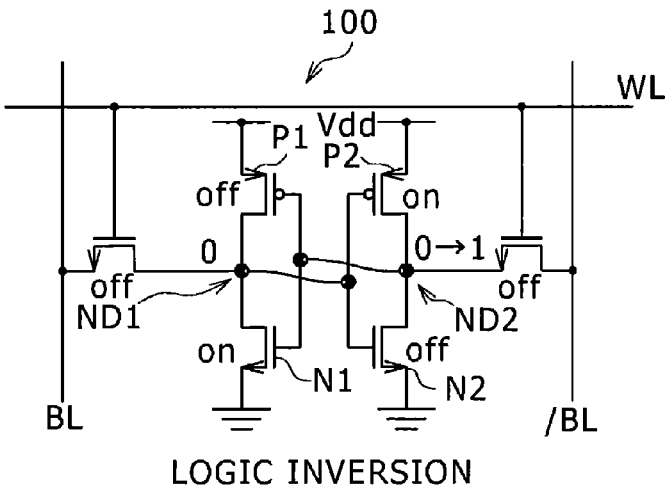

FIGS. 2A to 2C are explanatory circuit diagrams each showing a typical configuration of an SRAM cell 100 carrying out an operation in which an error is generated due to incidence of radiated light.

The SRAM cell 100 shown in the circuit diagrams of FIGS. 2A to 2C is an SRAM cell having a configuration including six transistors, two transistors of which are each a P-channel-type MOS transistor serving as a load. In the following description, each of the two P-channel-type MOS transistors is referred to simply as a PMOS transistor.

As shown in the circuit diagram of FIG. 2A, the SRAM cell 100 employs two load transistors P1 and P2, two driving transistors N1 and N2 as well as two transfer transistors N3 and N4. Each of the two load transistors P1 and P2 is a PMOS transistor whereas each of the two driving transistors N1 and N2 and the two transfer transistors N3 and N4 is an N-channel-type MOS transistor. In the following description, each of the N-channel-type MOS transistors is referred to simply as an NMOS transistor.

A VDD1 line is a power-supply line set at a power-supply voltage Vdd whereas a VSS line is another power supply line set at a reference voltage such as the ground voltage. The load transistor P1 and the driving transistor N1 are wired to each other to form a cascade connection between the VDD1 line and the VSS line. By the same token, the load transistor P2 and the driving transistor N2 are wired to each other to form a cascade connection between the VDD2 line and the VSS line.

The gate of the load transistor P2 and the gate of the driving transistor N2 are both connected to a storage node ND1 which serves as a connection point connecting the load transistor P1 to the driving transistor N1. By the same token, the gate of the load transistor P1 and the gate of the driving transistor N1 are both connected to a storage node ND2 which serves as a connection point connecting the load transistor P2 to the driving transistor N2.

One of the source and drain of the transfer transistor N3 is connected to the storage node ND1 whereas the other is connected to a bit line BL. The gate of the transfer transistor N3 is connected to a word line WL. By the same token, one of the source and drain of the transfer transistor N4 is connected to the storage node ND2 whereas the other is connected to a complementary bit line /BL. The gate of the transfer transistor N4 is connected also to the word line WL.

Figure 3:
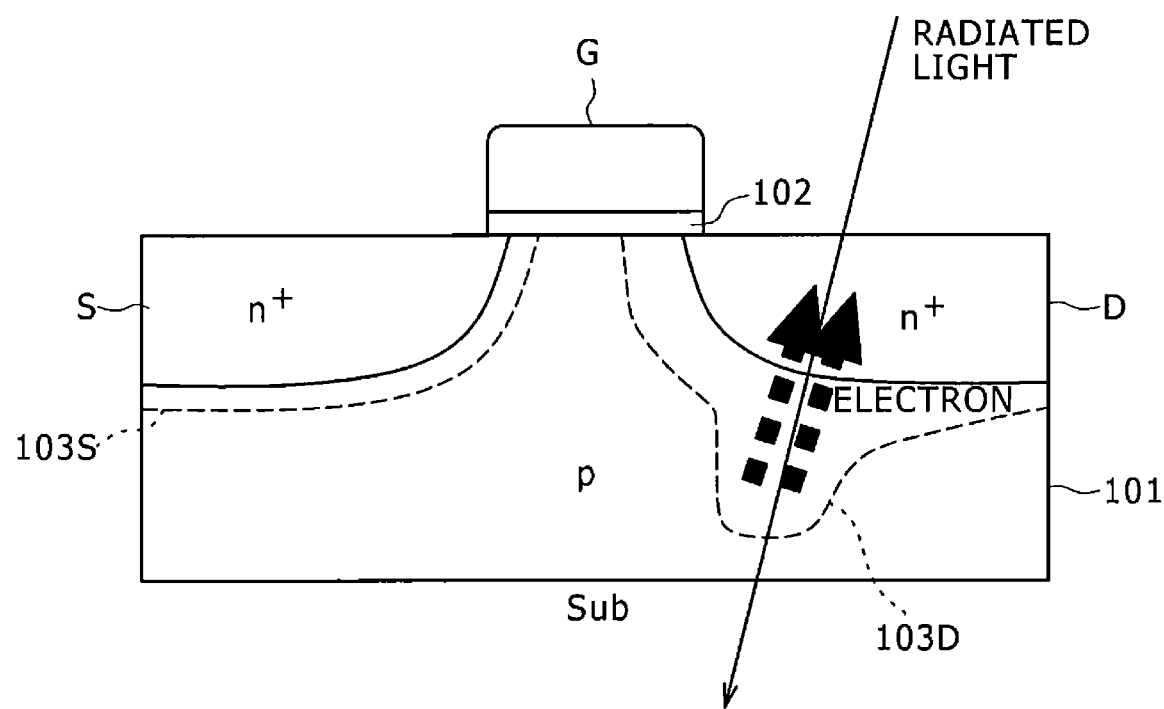
FIG. 3 is a rough explanatory cross-sectional diagram showing a transistor carrying out an operation affected by incidence of radiated light.

FIG. 3 is a rough explanatory cross-sectional diagram showing a transistor carrying out an operation affected by incidence of radiated light. The transistor shown in the cross-sectional diagram can be a first-conduction-type transistor employed in an SRAM cell 100 included in the SRAM block 201 or a first-conduction-type transistor employed in the logic circuit block 202. As an example, the first-conduction type in the following description is assumed to be the N type. By referring to the diagrams of FIGS. 2A and 3, generation of an SEU is explained as follows.

As shown in the circuit diagram of FIG. 2A, it is assumed that, prior to incidence of radiated light, the SRAM cell 100 is used for storing high-level bit data of 1 at the storage node ND1 and inverted (low-level) bit data of 0 at the storage node ND2.

As the radiated light hits the SRAM cell 100 storing the pieces of bit data as described above, the driving transistor N1 and the driving transistor N2 are much affected by the incidence of the light in particular.

To put it more concretely, the following description explains effects of the incidence of the radiated light on the operation carried out by the driving transistor N1 having the first-conduction type which is the N type in the case of this embodiment.

The bit data cited above is data which is appearing on the bit line BL before the incidence of the radiated light. The following description explains effects of the radiated light on the operation carried out by the driving transistor N1 employed in the SRAM cell 100 for bit data of 1. However, the following description also holds true for bit data of 0 if the phrase 'driving transistor N1' used in the description is replaced with the phrase 'driving transistor N2' whereas the phrase 'driving transistor N2' used in the description is replaced with the phrase 'driving transistor N1.'

Let the transistor shown in the cross-sectional diagram of FIG. 3 be the driving transistor N1. As shown in the cross-sectional diagram of FIG. 3, the driving transistor N1 has a source area S, a drain area D and a gate electrode G.

Each of the source area S and the drain area D is a first-conduction-type (or N-type) semiconductor area doped with N-type impurities at a relatively high concentration. Each of the source area S and the drain area D is created in a semiconductor area 101 of the opposite-conduction type referred to hereafter as a second-conduction type (or a P type). The semiconductor area 101 of the P type is a portion of the semiconductor substrate of the P type, or a P-type well (also referred to hereafter simply as a P well) created in the semiconductor substrate. In addition, the semiconductor area 101 can also be an SOI (Silicon On Insulator) layer of the P type.

The electric potential of the source area S is fixed at a reference voltage VSS whereas the drain area D is connected to the storage node ND1 and positively biased. (For more information, the reader is suggested to refer to the circuit diagrams of FIG. 2A).

The gate electrode G is exposed to the second-conduction-type semiconductor area 101 between the source area S and the drain area D through a gate insulation film 102.

The gate electrode G is connected to the storage node ND2. When the radiated light hits the SRAM cell 100 as shown in the circuit diagram of FIG. 2A, the gate electrode G is fixed at an electric potential equal to the reference voltage VSS through the driving transistor N2 which has been put in a turned-on state.

As shown in the cross-sectional diagram of FIG. 3, a depletion layer 103D on the positively biased drain side has been extended into an area greater than a depletion layer 103S on the source side. If the radiated light passes through the depletion layer 103D on the drain side, pairs each consisting of a hole and an electron are generated along the incidence path of the radiated light, further expanding the depletion layer 103D also along the incidence path. Even though some electrons are recombined with holes, a large number of pairs each consisting of a hole and an electron which are not recombined with each other are generated. Several holes not recombined with electrons are scattered to the second-conduction-type semiconductor area 101 whereas several electrons not recombined with holes are attracted to a drain electric field and moved to the drain area D. The electrons attracted by the drain electric field are drifted to the drain area D. Some of the electrons moving to the drain area D are spread. Thus, the electric potential appearing at the drain area D decreases. The decrease in drain electric potential is about to be compensated for by the fact that the turned-on state of the load PMOS transistor P1 shown in the circuit diagram of FIG. 2A is strengthened by the self bias of the load PMOS transistor P1. Since a large number of pairs each consisting of a hole and an electron which are not recombined with each other have been generated by the incidence of the radiated light, however, the decrease in drain electric potential cannot be compensated for in some cases.

In such cases, the data stored in the storage node ND1 makes a transition from 1 to 0 as shown in the circuit diagram of FIG. 2B. Thus, the driving transistor N2 makes a transition from a turned-on state to a turned-off state whereas the load transistor P2 makes a transition from a turned-off state to a turned-on state. As a result, a logic inversion error inverting the data stored initially in the storage node ND1 is generated as an SEU. To put it in detail, the generated SEU causes data of 0 to be conversely stored in the storage node ND1 and data of 1 to be conversely stored in the storage node ND2 as shown in the circuit diagram of FIG. 2C.

As a countermeasure against such an SEU, it is desirable to add an ECC circuit to the SRAM block 201. The ECC circuit makes use of error detection codes such as parity bits. However, the countermeasure provided by the ECC circuit as a countermeasure against the SEU soft error is not so effective for the SET. Thus, the countermeasure provided by the ECC circuit as a countermeasure against the SEU soft error has only small effect on the logic circuit block 202 which generates the SET as a predominant soft error.

For the reason described above, in this embodiment, an SET countermeasure to be described later needs to be taken for the logic circuit block 202 shown in the block diagram of FIG. 1.

As is the case with the SRAM cell 100 shown in the circuit diagrams of FIGS. 2A to 2C, as described above, an SRAM cell employed in SRAM block 201 serving as the memory circuit section 201 employs two inverters connected to each other in a basic configuration referred to as a cross-coupling configuration. In the basic cross-coupling configuration, the input of a specific one of the inverters is connected to the output of the other converter whereas the output of the specific inverter is connected to the input of the other converter. Such a basic cross-coupling configuration is also adopted in other circuits such as a latch circuit.

Next, the logic circuit block 202 serving as the non-memory circuit section is explained as follows. In general, the logic circuit block 202 serving as the non-memory circuit section includes a combinational logic circuit and a sequential logic circuit. A combinational logic circuit is a circuit having an output logic value determined by a combination of input logic values of the circuit. On the other hand, a sequential logic circuit is a circuit having an output logic value determined by changes exhibited by an input logic value of the circuit as changes along the time axis. Generation of an SET in the combinational logic circuit is described as follows.

Figure 4A:
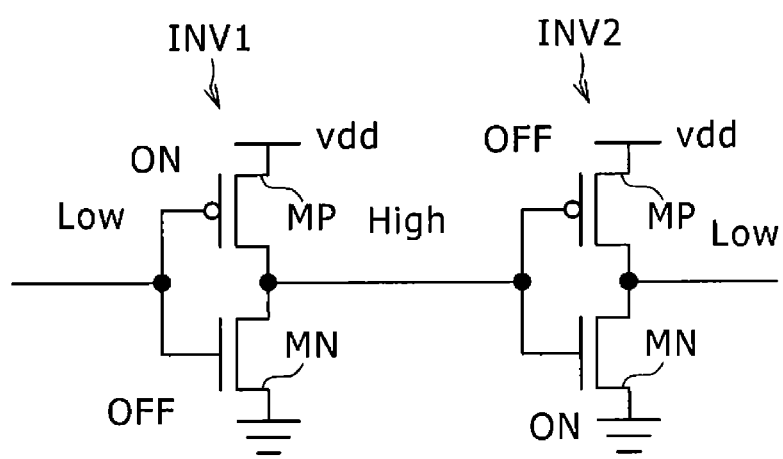
FIGS. 4A and 4B are a plurality of explanatory circuit diagrams each showing a series connection of inverters which serve as the basic configuration of a buffer circuit.
Figure 4B:
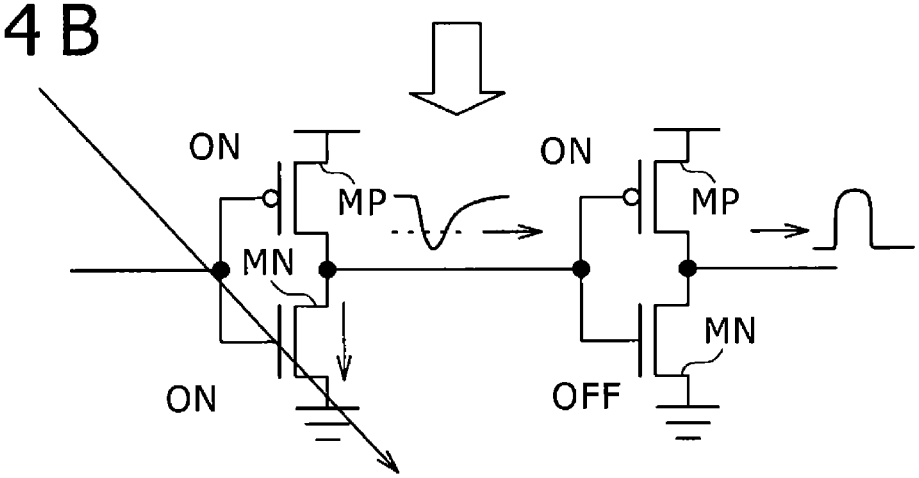

FIGS. 4A and 4B are a plurality of circuit diagrams each showing a configuration composed of a series connection of inverters INV1 and INV2. The configuration shown in each of the circuit diagrams of FIG. 4 is known as the basic configuration of the combinational logic circuit. If the number of inverters included in the basic configuration is even, the basic configuration serves as a buffer. If the number of inverters included in the basic configuration is odd, on the other hand, the basic configuration serves as an inverter which is also referred to as a logic inversion circuit. A buffer and an inverter also play a role in formation of the waveform of a transmitted signal in addition to a role in logic control.

In the following description, the inverters INV1 and INV2 employed in a buffer circuit shown in each of the circuit diagrams of FIGS. 4A and 4B are denoted by reference notation INV in case it is not necessary to distinguish the inverters INV1 and INV2 from each other. In every inverter INV, an NMOS transistor MN and a PMOS transistor MP are connected in series to each other. The gate of the NMOS transistor MN is connected to the gate of the PMOS transistor MP to form the input node of the inverter INV. A connection point connecting the PMOS transistor MP to the NMOS transistor MN serves as the output node of the inverter INV.

When radiated light hits the inverter INV1 placed at the front stage as shown in the circuit diagram of FIG. 4A, the incidence of the radiated light particularly has a big effect on the NMOS transistor MN, lowering an electric potential appearing at the drain of the NMOS transistor MN. At that time, an electric potential appearing at the source of the PMOS transistor MP is also about to go down as well. Since the electric potential appearing at the source of the PMOS transistor MP is fixed at the power-supply voltage Vdd, however, the electric potential appearing at the source of the PMOS transistor MP remains all but constant.

To put it in more detail, the incidence of the radiated light at the inverter INV1 causes the electric potential appearing at the drain of the NMOS transistor MN to go down as already described before by referring to the cross-sectional diagram of FIG. 3. Thus, as shown in the circuit diagram of FIG. 4B, the output of the inverter INV1 swings to a negative level. When the output of the inverter INV1 swings to a negative level, a voltage appearing between the source and drain of the PMOS transistor MP increases so that the turned-on state of the PMOS transistor MP is strengthened. Since the strengthened turned-on state of the PMOS transistor MP compensates for the reduced amount of charge supplied by the power-supply line set at the power-supply voltage Vdd, the output of the inverter INV1 recovers from the negative level in many cases.

Figure 5A:
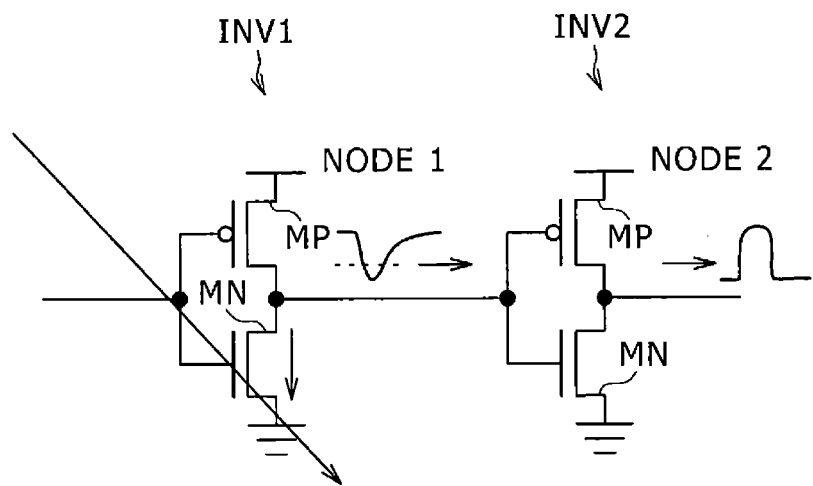
FIGS. 5A and 5B are a plurality of explanatory diagrams showing a series connection of inverters provided at two stages and graphs representing results of a simulation comparing the outputs of the inverters.
Figure 5B:
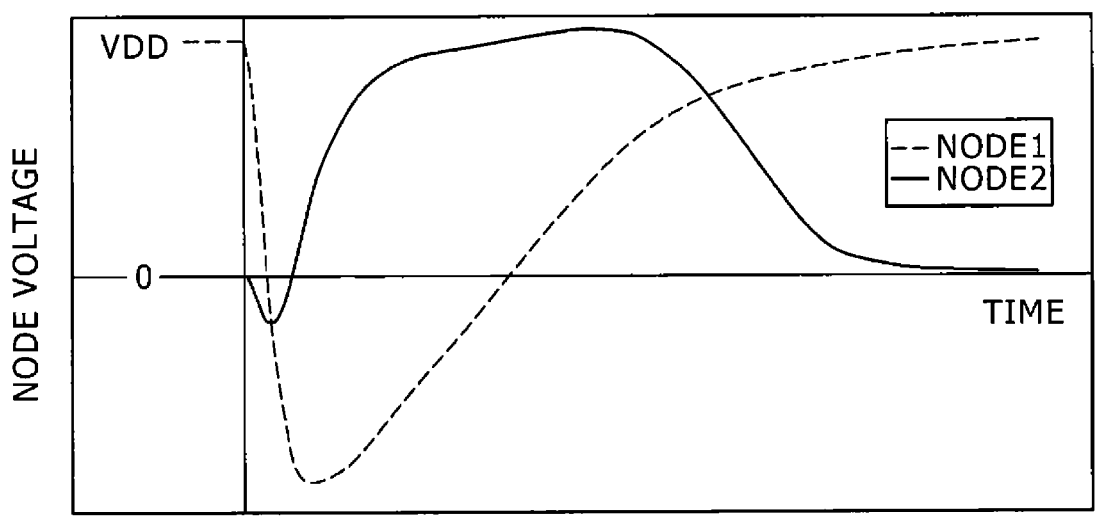

FIG. 5B is a diagram showing graphs representing results of a simulation comparing the waveforms of signals appearing at output nodes 1 and 2 of the two inverters INV1 and INV2 respectively. FIG. 5A is the same circuit diagram as that of FIG. 4B.

As shown in the diagram of FIG. 5B, the dashed-line waveform of the signal appearing at output node 1 of the inverter INV1 indicates an instantaneous drop in electric potential to a negative level for the reason described previously but, thereafter, the signal appearing at output node 1 of the inverter INV1 recovers gradually from the instantaneous drop to the negative level.

When the drop in electric potential to the negative level shown by the waveform of the signal appearing at node 1 is supplied to the inverter INV2 provided at the next stage, as indicated by a solid-line waveform of the signal appearing at output node 2 of the inverter INV2, not only is the signal appearing at output node 2 simply inverted, but a new waveform of the signal appearing at output node 2 is also created. Thus, the inverter INV2 generates an output signal to serve like a transmitted positive pulse which is actually a pseudo pulse. This pseudo pulse is reformed at a subsequent stage into a pulse having all but a perfect rectangular waveform so that a signal logic value generated later can be undesirably incorrect in some cases.

Since such a pseudo pulse is also generated at other inverters, countless pseudo pulses are produced and transmitted sequentially with timings shifted a little bit from each other.

In a combinational logic circuit with such two inverters serving as a basic configuration, a transmitted logic value changes with time so that logic at a certain node cannot be predicted. Thus, it is difficult to apply the error correction technology based on an ECC circuit to the combinational logic circuit.

A technology for preventing a soft error (or the SET in particular) from being generated in a non-memory circuit (or, in particular, a circuit such as a combinational logic circuit in which a logic value changes with time) as described above is of importance to the ability to further miniaturize the LSI in the future.

A microphenomenon is a phenomenon in which an electric potential appearing in the first-conduction-type area (that is, the drain area D of the N type in the case of this embodiment) drops. It is to be noted that the microphenomenon occurs as a phenomenon common to the SEU and the SET. In the case of the SEU, however, a feedback loop for holding data in the memory exists so that the electric-potential drop caused by incidence of radiated light by no means propagates naturally to a circuit provided at the next stage as long as data is not output intentionally from the memory. Since the miniaturization of the semiconductor memory cell is making progress spectacularly, however, a memory circuit section may generate an SEU at a higher sensitivity to incidence of radiated light. That is to say, the SEU may be generated by an electric-charge amount smaller than the electric-charge amount resulting in the SET.

This embodiment relates to a countermeasure against a soft error such as the SET which is particularly difficult to eliminate by merely providing error avoidance means at the circuit level. Even if it is possible to provide error avoidance means at the circuit level as a countermeasure against the SET, redundancy encountered as a result of such a measure will go beyond a range of tolerance.

To put it more concretely, the P-type impurity concentration of the P-type semiconductor area 101 including a channel created for a N-channel-type transistor employed in the logic circuit block 202 is made lower than the P-type impurity concentration of a P-type semiconductor area including a channel created for an N-channel-type transistor employed in the SRAM block 201.

The above statement can be generalized as follows:

"The second-conduction-type impurity concentration of a second-conduction-type semiconductor area including a channel created for a first-conduction-type transistor employed in the non-memory circuit section is made lower than the second-conduction-type impurity concentration of a second-conduction-type semiconductor area including a channel created for a first-conduction-type transistor employed in the memory circuit section."

It is possible to provide a configuration in which the relatively low second-conduction-type impurity concentration described above is obtained by setting the concentration of a second-conduction-type semiconductor area 101 itself at a value smaller than the normal concentration.

As an alternative, it is possible to provide a configuration in which the second-conduction-type impurity concentration of the second-conduction-type semiconductor area 101 is set at a value equal to the normal concentration right after a process of creating the second-conduction-type semiconductor area 101. Later on, however, impurities of the opposite type are injected into the second-conduction-type semiconductor area 101 a little bit by carrying out a counter doping process. As obvious from the descriptions given earlier, in the case of this embodiment, the second-conduction type is the P type whereas the opposite type is the N type.

The normal concentration cited above is a concentration prescribed on the basis of conditions of a process carried out to obtain a uniform threshold voltage for all transistors in circuits other than the logic circuit block 202 serving as the non-memory circuit section. The circuits other than the logic circuit block 202 include the SRAM block 201 serving as the memory circuit section.

However, it is to be noted that, if the P-type impurity concentration of the second-conduction-type (P-type) semiconductor area 101 is simply set at a relatively small value, the threshold voltage of transistors also becomes lower as well. Due to the progress of the miniaturization, on the other hand, it is feared that the low threshold voltage of transistors is accompanied by larger leak currents flowing in the transistors.

In order to solve the problem of a larger leak current flowing in a transistor, a halt operation control technique is introduced. Referred to as a power-gate technique, this technique is adopted to reduce the magnitude of a leak current flowing in a transistor. As an alternative method, device parameters of the transistor are changed in order to increase the threshold voltage of the transistor. For example, the material used for making the gate electrode of a transistor is changed to another whereas the size of the impurity area of the source employed in the transistor is optimized so that, even if the second-conduction-type impurity concentration of the second-conduction-type semiconductor area 101 is set at a relatively small value, the transistor can be created with the threshold voltage thereof not decreased to such a low level.

It is desirable to reduce the second-conduction-type (P-type) impurity concentration of the second-conduction-type semiconductor area 101 to a small value of an order which puts a parasitic bipolar transistor in the MIS (Metal Insulator Semiconductor) transistor in a turned-on state with ease.

By referring to diagrams of FIGS. 6 to 9, the following description explains the parasitic bipolar transistor cited above and a base-concentration reduction effect on the parasitic bipolar transistor. The base-concentration reduction effect is an effect provided by the present invention.

Figure 6:
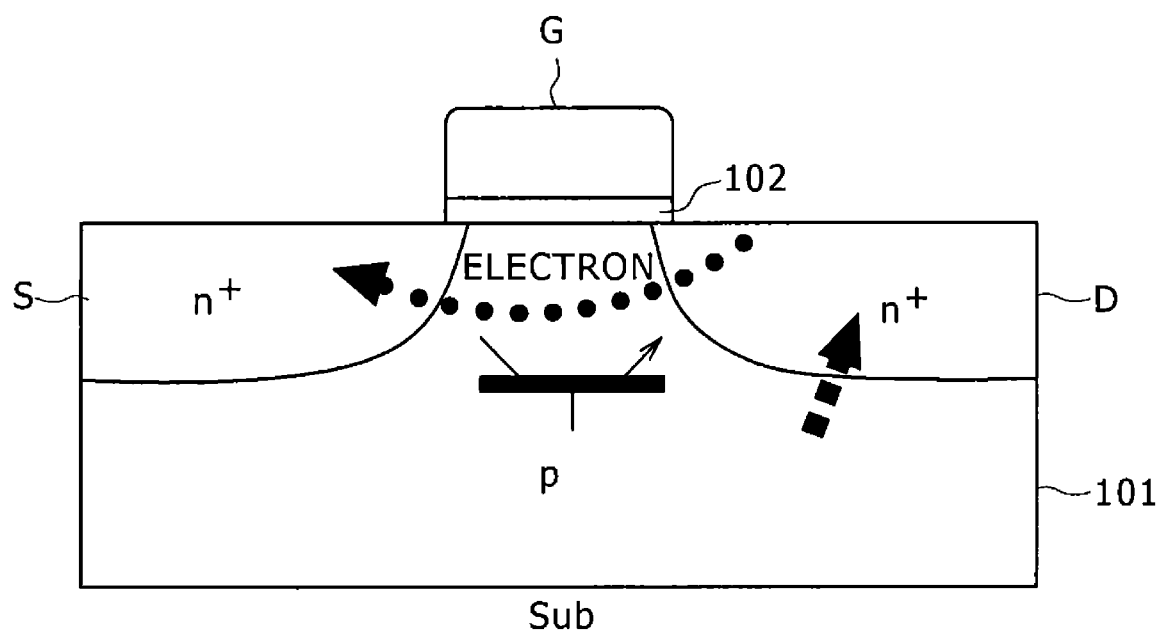
FIG. 6 is a cross-sectional diagram showing a MIS transistor in which a parasitic bipolar transistor is created.

FIG. 6 is a cross-sectional diagram showing the aforementioned MIS transistor in which a parasitic bipolar transistor is created. As shown in the cross-sectional diagram of FIG. 6, the parasitic bipolar transistor is created in the substrate (or a well) of the MIS transistor in some cases. The N-channel-type MIS transistor shown in the cross-sectional diagram of FIG. 6 includes a source area S and a drain area D which are each a semiconductor area of the N type as well as a second-conduction-type semiconductor area 101 which is of the P type. In such a MIS transistor, a parasitic bipolar transistor of an NPN type may be created. In this case, the bipolar transistor of an NPN type includes the source area S serving as a collector area, the drain area D serving as an emitter area and the second-conduction-type semiconductor area 101 serving as a base area.

If the parasitic bipolar transistor is put in a turned-on state at a time of incidence of radiated light, electrons that would cause an electric potential appearing at the drain area D to go down can be driven to the source area S as shown in the cross-sectional diagram of FIG. 6 by the parasitic bipolar transistor which is put in a turned-on state at the incidence time.

However, an ordinary transistor adopts a latch-up countermeasure for preventing the parasitic bipolar transistor from being put in a turned-on state when the electric potential appearing in the second-conduction-type semiconductor area 101 rises.

Inventors of the present invention have discovered the fact that, by lowering the P-type concentration of the second-conduction-type semiconductor area 101 a little bit to a level of an order which does not affect the original purpose of the latch-up countermeasure, or an order which does not reduce the threshold voltage, there can be provided a big effect on avoidance of generation of the SET.

Figure 7A:
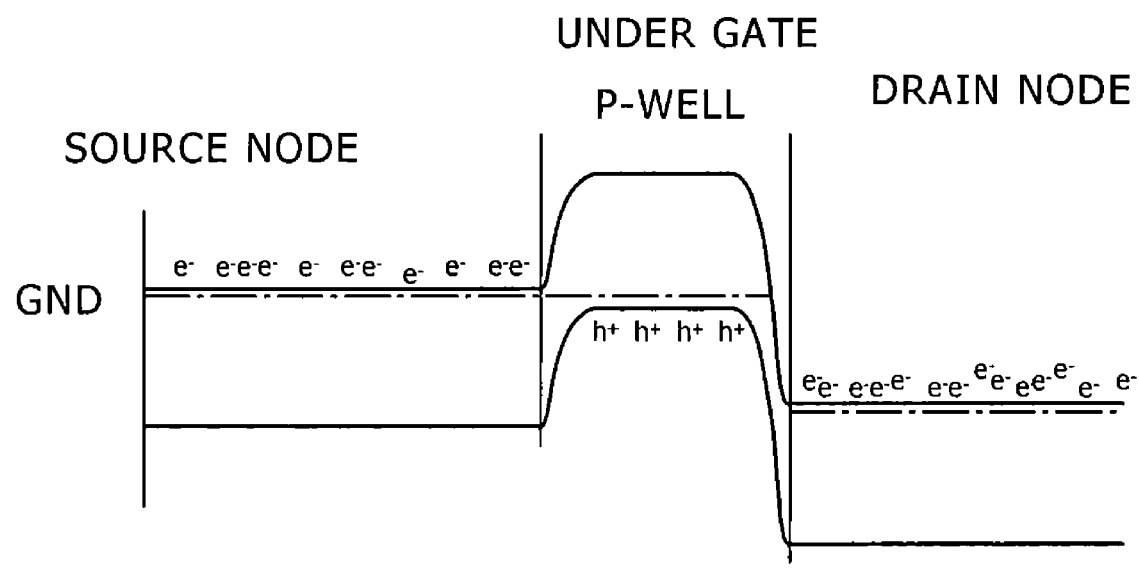
FIGS. 7A and 7B are a plurality of energy-band diagrams showing a difference obtained as a result of a taken countermeasure.
Figure 7B:
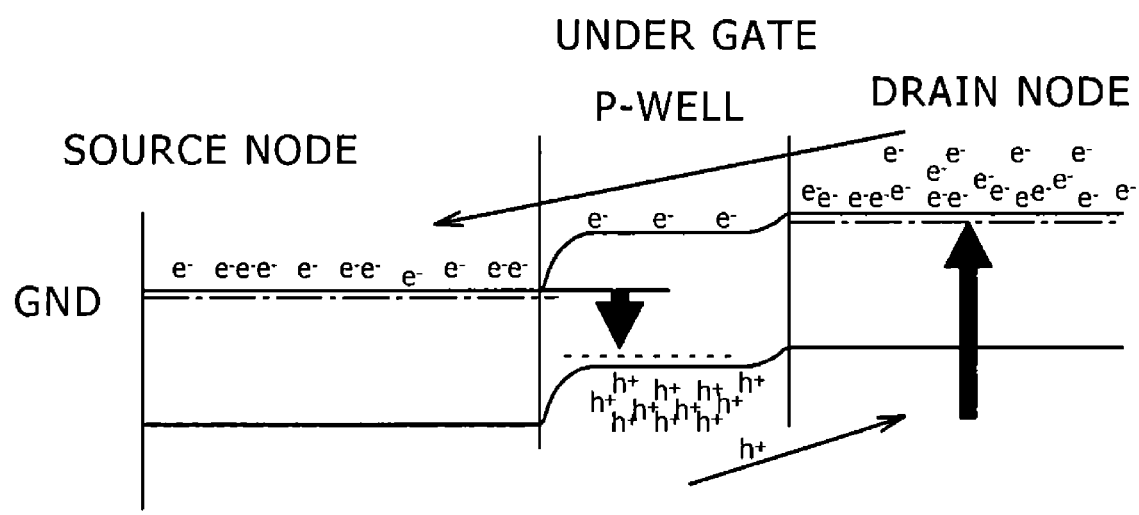
Figures 8A, 8B:
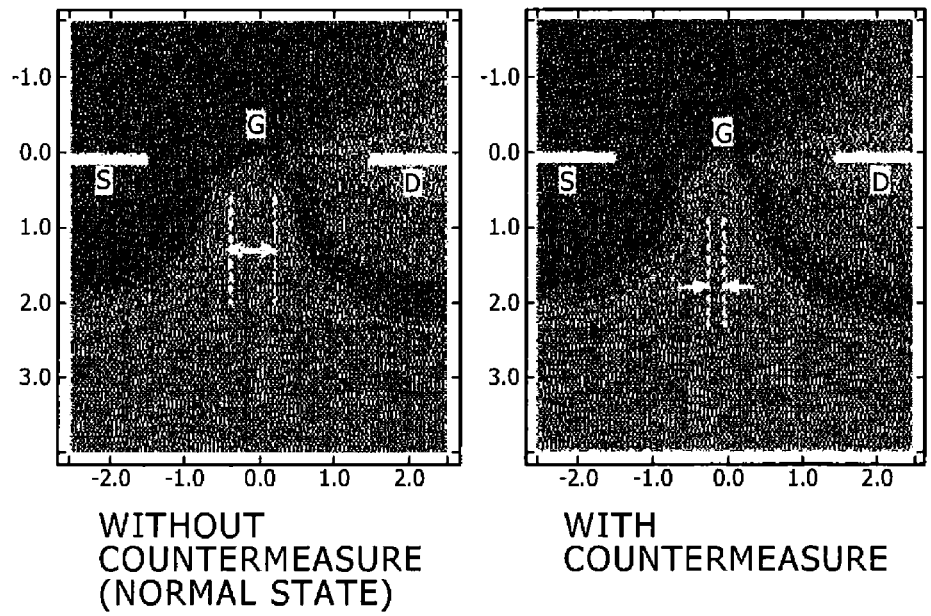
FIGS. 8A and 8B are a plurality of diagrams showing simulation results indicating a base-width difference obtained as a result of a taken countermeasure.
Figure 9:
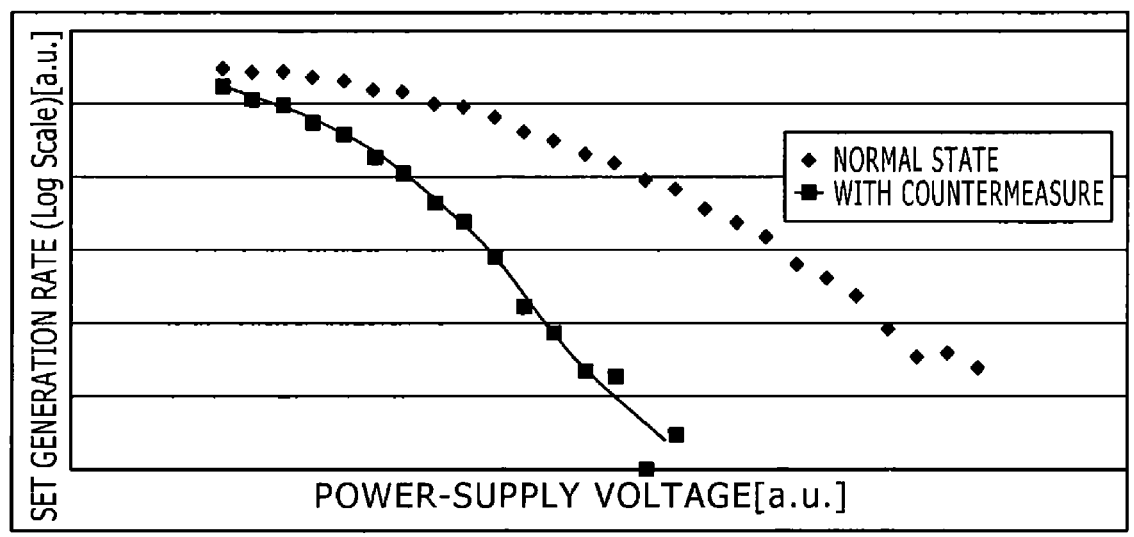
FIG. 9 is a diagram showing graphs comparing SET generation rates in a pre-countermeasure (normal) state and a post-countermeasure state.

FIGS. 7A and 7B are a plurality of energy-band diagrams showing a SET avoidance effect exhibited by a countermeasure taken by reducing a P-type concentration, FIGS. 8A and 8B are a plurality of diagrams showing simulation results indicating a base-width difference obtained as a result of the countermeasure whereas FIG. 9 is a diagram showing graphs comparing SET generation rates in a pre-countermeasure (normal) state and a post-countermeasure state.

By reducing the P-type concentration of the second-conduction-type semiconductor area 101, the width of the base can be reduced substantially as indicated by the simulation results shown in the diagrams of FIGS. 8A and 8B. By lowering the P-type concentration of the second-conduction-type semiconductor area 101 a little bit in an infinitesimal MOS transistor at the contemporary integration scale which has been sufficiently miniaturized, depletion layers from the source and the drain are expanded considerably into the second-conduction-type semiconductor area 101. By lowering the P-type concentration of the second-conduction-type semiconductor area 101 merely a little bit, the width of the base can be reduced to a fraction.

FIG. 7A is an energy-band diagram showing a pre-countermeasure (normal) state whereas FIG. 7B is an energy-band diagram showing a post-countermeasure state. As shown in the energy-band diagrams of FIGS. 7A and 7B, an electric-potential barrier in a P-well area (or base area) right below the gate between the emitter and the collector in the pre-countermeasure state is lowered.

For these two reasons, that is, due to the fact that the width of the base is reduced to a fraction and the fact that the electric-potential barrier is lowered, by lowering the P-type concentration of the second-conduction-type semiconductor area 101 only a little bit, the parasitic bipolar transistor can be put in a turned-on state. With the parasitic bipolar transistor put in a turned-on state, as shown in the energy-band diagram of FIG. 7B, electrons generated by the incidence of the radiated light are expelled from the drain area D serving as the emitter of the parasitic bipolar transistor to the source area S serving as the collector of the parasitic bipolar transistor by way of a channel created in the transistor. On the other hand, as shown in the energy-band diagram of FIG. 7B, holes flow from the source area S serving as the collector to the drain area D serving as the emitter by way of the second-conduction-type semiconductor area 101 serving as the base through a path on the deep side of the substrate.

As described above, FIG. 9 is a diagram showing graphs comparing SET generation rates with respect to power-supply voltage in a pre-countermeasure (normal) state and a post-countermeasure state.

As obvious from the graphs, by lowering the P-type concentration of the second-conduction-type semiconductor area 101 only a little bit, the rate at which SETs are generated can be lowered by two to three digits.

In accordance with the embodiment described above, the parasitic bipolar transistor is turned on. The base of the parasitic bipolar transistor is the second-conduction-type semiconductor area 101 right below the gate of the first-conduction-type transistor which is an NMOS transistor in the case of this embodiment. With the parasitic bipolar transistor turned on, electrons flowing into the drain of the NMOS transistor are expelled to the source of the NMOS transistor.

The P-type concentration of the second-conduction-type semiconductor area 101 is set in advance at such a low level that the parasitic bipolar transistor is turned on with ease at a time of incidence of radiated light.

To put it more concretely, in order to enhance the performance of the parasitic bipolar transistor, it is nice to adjust the channel doping process of the second-conduction-type semiconductor area 101. As an alternative, a counter-doping process can be carried out on the second-conduction-type semiconductor area 101.

In a process of creating the NMOS transistor, acceptors are normally doped into the surface portion (or a channel creation area) of the second-conduction-type semiconductor area 101. The process of doping acceptors is a known process which is normally carried out in order to position a channel at a location deeper a little bit than the substrate surface having many defects or in order to adjust the threshold voltage of the transistor in many cases. In the case of this embodiment, the existing acceptor doping process is carried out by setting the dope concentration at a value smaller a little bit than the normal value in order to enhance the performance of the parasitic bipolar transistor.

Thus, without area and performance losses and without an increase in process count and an increase in manufacturing cost, it is possible to effectively suppress generation of soft errors, particularly, SETs.

Results of actual experiments indicate that the soft-error generation rate can be reduced by two to three digits.

It is to be noted that the effect of avoiding an SET has been verified and, in addition, by adjusting a channel doping profile, an effect of avoiding an SEU can also be demonstrated.

In this embodiment, a countermeasure to set the second-conduction-type impurity concentration of a second-conduction-type semiconductor area including a channel created for a first-conduction-type transistor at a relatively low level is applied to the non-memory circuit section shown in the block diagram of FIG. 1 only or, particularly applied to the logic circuit block 202 only. This is because, from the entire-device point of view, the effect of the concentration reduction cannot be expected for an SRAM. Thus, the countermeasure is applied to a circuit portion for which the countermeasure is more effective. As a result, rather than providing a feature of allowing this embodiment of the present invention to be applied to the whole semiconductor integrated circuit 200A, the embodiment gives the merit of an ability to minimize the effect of a change in circuit characteristic.

2. Second Embodiment

A second embodiment (and also a third embodiment to be described later) implement a typical semiconductor integrated circuit for a particular case in which it is desirable to further restrict the range of the countermeasure to set the second-conduction-type impurity concentration of a second-conduction-type semiconductor area including a channel created for a first-conduction-type transistor at a level relatively lower a little bit than the normal level. The second-conduction-type semiconductor area serves as a channel creation area which is used as the base area of a parasitic bipolar transistor created in the first-conduction-type transistor.

Figure 10:
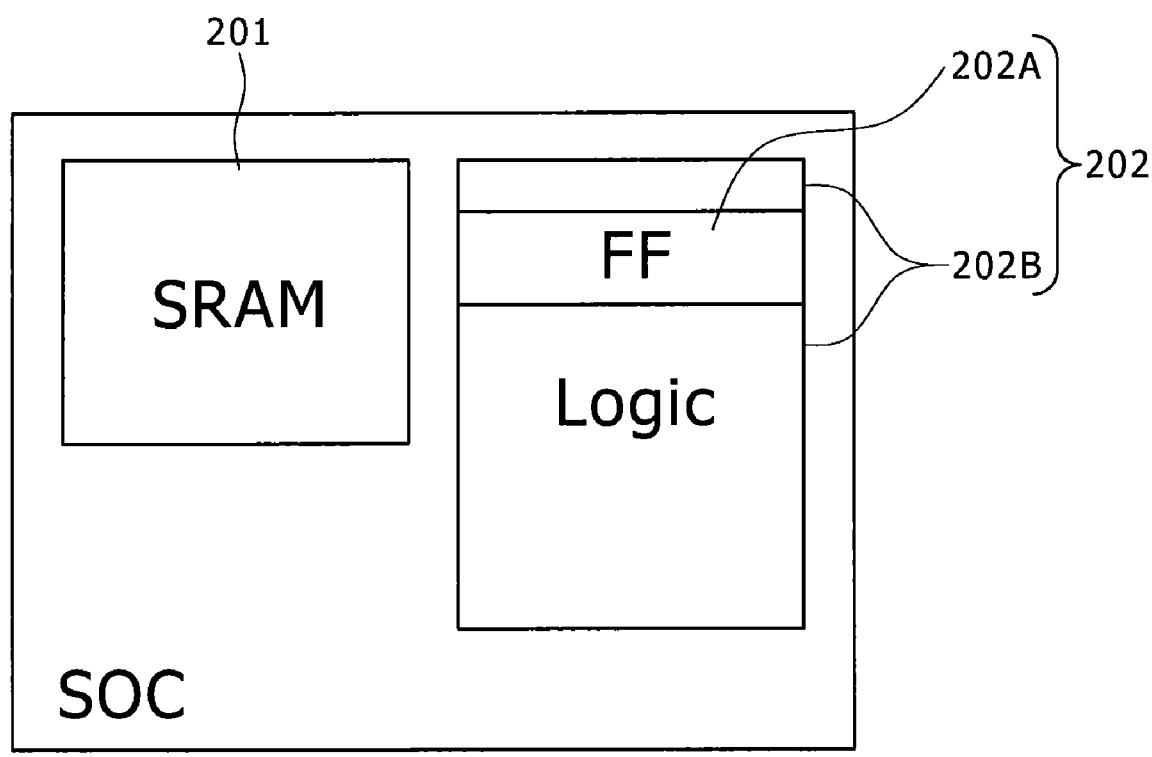
FIG. 10 is a rough block diagram showing a semiconductor integrated circuit according to a second embodiment.

FIG. 10 is a rough block diagram showing a semiconductor integrated circuit 200B according to the second embodiment.

The semiconductor integrated circuit 200B shown in the block diagram of FIG. 10 includes an SRAM block 201 serving as the memory circuit section and a logic circuit block 202 serving as the non-memory circuit section in an SOC chip configuration which is itself identical with the configuration shown in the block diagram of FIG. 1.

In the case of the second embodiment, the logic circuit block 202 employed in the semiconductor integrated circuit 200B shown in the block diagram of FIG. 10 further includes a sequential logic circuit 202A typically having FF (flip-flop) circuits to serve as main configuration components and a combinational logic circuit 202B typically having inverters INV to serve as main configuration components. The inverters INV are connected to each other in series as shown in the circuit diagrams of FIGS. 4 and 5B.

In the case of the second embodiment, however, only the combinational logic circuit 202B takes the countermeasure to set the second-conduction-type impurity concentration of a second-conduction-type semiconductor area including a channel created for a first-conduction-type transistor at a level relatively lower a little bit than the normal level.

This is because, in the logic circuit block 202, the sequential logic circuit 202A has data holding circuits such as flip-flop circuits FF and the basic configuration of the data holding circuit is a combination of a plurality of inverted-logic gate circuits as is the case with the SRAM cell 100 shown in the circuit diagrams of FIGS. 2A to 2C. The inverted-logic gate circuits employed in the basic configuration of the data holding circuit are a variety of logic-inversion-type gate circuits such as a NAND gate, a NOR gate and an EOR gate in addition to an inverter. Thus, the SEU is generated instead of the SET. For the reason described above, the effect of the countermeasure to set the second-conduction-type impurity concentration at a level relatively lower a little bit than the normal level is small for the sequential logic circuit 202A. Accordingly, it is desirable to apply the second embodiment of the present invention to only the combinational logic circuit 202B employed in the logic circuit block 202 to serve as a circuit which employs only few data holding circuits.

Figure 11:
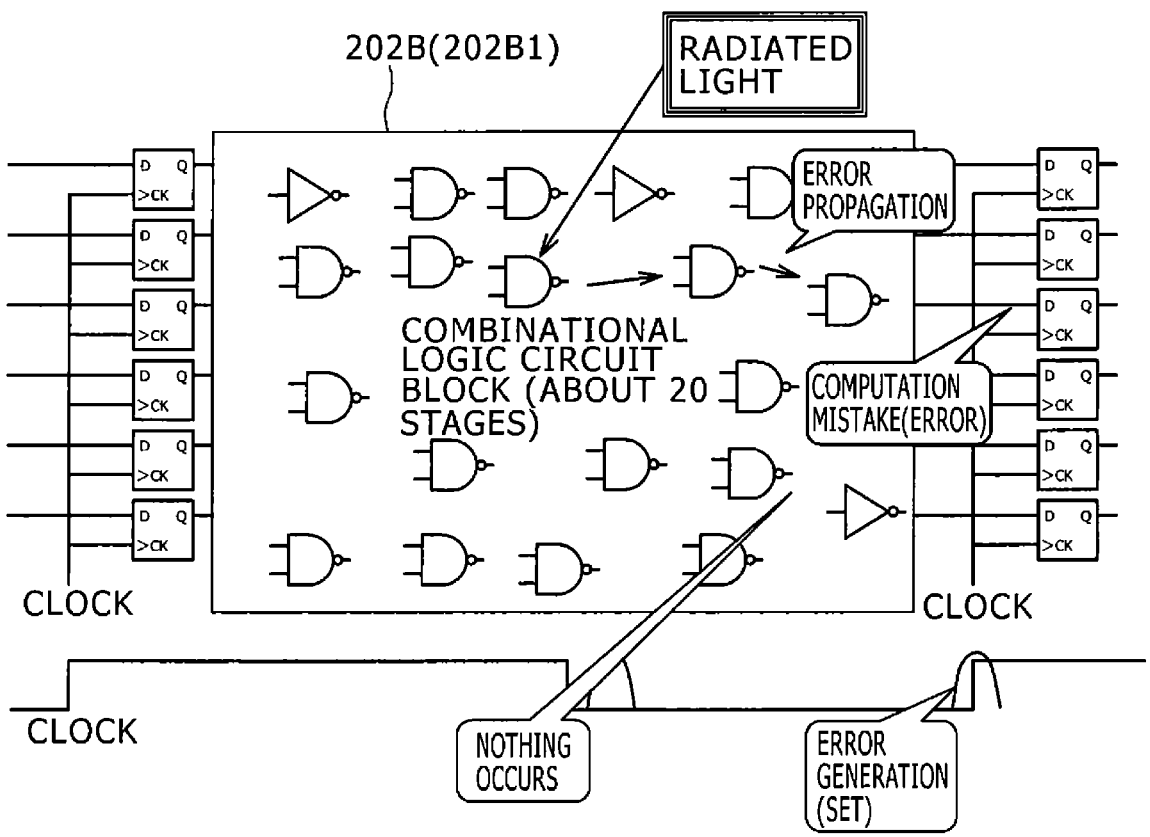
FIG. 11 is a diagram showing a typical connection connecting a combinational logic circuit to flip-flop circuits in the second embodiment.

FIG. 11 is a diagram showing a typical connection connecting the combinational logic circuit 202B to the flip-flop circuits FF of the sequential logic circuit 202A in the second embodiment.

In the typical example shown in the diagram of FIG. 11, the combinational logic circuit 202B is a circuit for carrying out certain desired logic processing. For every functional circuit block in such a logic processing circuit, a number of flip-flop circuits FF are laid out on the input, output and/or inter-stage portion of the functional circuit block.

A clock signal is supplied to the clock input terminal of each of the flip-flop circuits FF. In the diagram of FIG. 11, the clock input terminal of each of the flip-flop circuits FF is denoted by symbol ">CK."

In addition, a variety of control signals are also supplied to each of the flip-flop circuits FF. The control signals include a clear signal as well as a preset signal and, in accordance with the type of the flip-flop circuit FF, the control signals may also include an enable signal.

The clear signal supplied to a flip-flop circuit FF is a signal for resetting the output of the flip-flop circuit FF. The output of a flip-flop circuit FF is an input to a combinational logic circuit 202B provided at a stage following the flip-flop circuit FF. The preset signal supplied to a flip-flop circuit FF is used when it is desired to supply certain logic to the next stage following the flip-flop circuit FF. The preset signal can also be used for splitting a logic input and a logic output. The enable signal is a signal for controlling the operation of the flip-flop circuit FF to which the enable signal is supplied.

By virtue of such a configuration, it is possible to establish synchronization in an array of logic values transmitted between logic blocks and possible to change a logic value in the course of transmission. Thus, the configuration is generally adopted in order to carry out correct logic processing.

If the countermeasure against the SET is applied to a flip-flop circuit FF employed in the sequential logic circuit 202A, however, a big demerit caused by an unnecessary change is expected.

For the reason described above, the countermeasure against the SET is applied only to the combinational logic circuit 202B for which the effect of the countermeasure is big.

The SET suppression itself is similar to that of the first embodiment. Thus, the effect of the countermeasure against the SET is the same as that of the first embodiment.

It is to be noted that the sequential logic circuit 202A (and, particularly, the flip-flop circuits FF employed in the sequential logic circuit 202A) can be included in the range of the memory circuit section due to the fact that the sequential logic circuit 202A is a circuit used for temporarily storing data. Thus, the second embodiment is a typical example of the countermeasure taken in the same way as that according to the first embodiment as a countermeasure of setting the second-conduction-type impurity concentration in the non-memory circuit section at a relatively small value.

3. Third Embodiment

Figure 12:
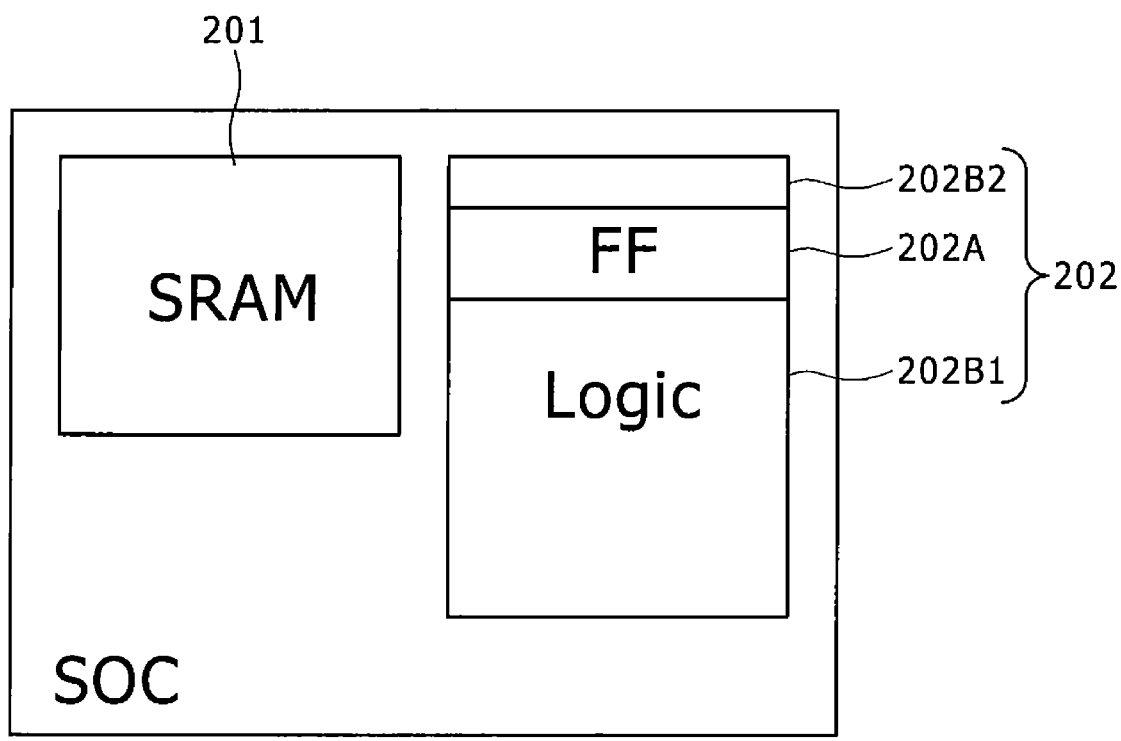
FIG. 12 is a rough block diagram showing a semiconductor integrated circuit according to a third embodiment.

FIG. 12 is a rough block diagram showing a semiconductor integrated circuit 200C according to a third embodiment.

The semiconductor integrated circuit 200C shown in the block diagram of FIG. 12 includes an SRAM block 201 serving as the memory circuit section and a logic circuit block 202 serving as the non-memory circuit section in an SOC chip configuration which is itself identical with the configurations shown in the block diagrams of FIGS. 1 and 10.

The logic circuit block 202 employed in the semiconductor integrated circuit 200B shown in the block diagram of FIG. 12 also includes a sequential logic circuit 202A typically having FF (flip-flop) circuits to serve as main configuration components and a combinational logic circuit 202B typically having inverters INV to serve as main configuration components as is the case with the configuration shown in the block diagrams of FIG. 10.

In the case of the third embodiment shown in the block diagram of FIG. 12, however, the combinational logic circuit 202B includes a logic processing portion 202B1 and a signal generating portion 202B2. The logic processing portion 202B1 is shown as the combinational logic circuit 202B in the diagram of FIG. 11 whereas the signal generating portion 202B2 is a circuit section for supplying signals to flip-flop circuits FF included in the sequential logic circuit 202A. The signal generating portion 202B2 is a typical example of a clock generating circuit or a control-signal generating circuit.

In the case of the third embodiment, only the signal generating portion 202B2 included in the combinational logic circuit 202B takes the countermeasure to set the second-conduction-type impurity concentration of a second-conduction-type semiconductor area including a channel created for a first-conduction-type transistor at a level relatively lower a little bit than the normal level.

This is because a circuit used for temporarily storing data is not always excluded from the logic processing portion 202B1 employed in the combinational logic circuit 202B and, on top of that, the logic processing portion 202B1 employed in the combinational logic circuit 202B may include a data storage circuit created by combining a number of logic processing gates in some cases. Provided with a function to reduce or adjust a signal propagation delay, on the other hand, the signal generating portion 202B2 is mainly a group of buffer circuits in many cases. Thus, if the present invention is applied only to the signal generating portion 202B2 included in the combinational logic circuit 202B, the present invention will demonstrate a biggest effect.

As described above, the signal generating portion 202B2 included in the combinational logic circuit 202B takes the countermeasure to set the second-conduction-type impurity concentration of a second-conduction-type semiconductor area including a channel created for a first-conduction-type transistor at a level relatively lower a little bit than the normal level. It is desirable to set the relatively low level, at which the second-conduction-type impurity concentration is reduced, in such a range that the countermeasure itself does not affect the characteristics of other transistors and other circuits. If the relatively low level at which the second-conduction-type impurity concentration is reduced is not increased to a certain degree, however, this countermeasure against the SET may not be sufficient in some cases. In such cases, in the third embodiment, the circuit portions each serving as a subject of the countermeasure against the SET are limited to only circuit portions for which the countermeasure is capable of demonstrating a biggest effect. In this way, it is possible to establish a balance between the effort to demonstrate a biggest effect of the countermeasure against the SET and the effort to avoid the effect of the countermeasure on other transistors and other circuits.

The signal generating portion 202B2 is typically a buffer for propagating a clock signal to a flip-flop circuit FF employed in the sequential logic circuit 202A and/or a buffer for propagating asynchronous signals such as a clear signal and a preset signal to the flip-flop circuit FF. Such buffers are prone to SETs. Thus, by applying the SET countermeasure to the buffers in accordance with the third embodiment, the entire circuit can be efficiently made more tolerant of soft errors.

The SET suppression itself is similar to that of the first embodiment. Thus, it is possible to demonstrate the same effect of the SET countermeasure as that of the first embodiment.

In addition, it is possible to vary the degree of a relatively low value to which the second-conduction-type impurity concentration is reduced. That is to say, the impurity concentration of the signal generating portion 202B2 is reduced most and, then, the impurity concentration of the logic processing portion 202B1 is reduced to a value greater than the value to which the impurity concentration of the signal generating portion 202B2 has been reduced.

4. Modified Versions

Since the present invention is applicable to the MIS transistor which is the smallest unit of logic circuits, the present invention can be applied to almost all logic circuits which each make use of a combinational logic circuit.

In addition, in the first to third embodiments described above, the NMOS transistor is taken as an example in order to make the explanation easy to give and easy to understand. However, the present invention is also effective for a SET caused by a PMOS transistor in entirely the same way as generation of a SET caused by an NMOS transistor. That is to say, the present invention can also be used to avoid or suppress generation of a SET caused by a PMOS transistor. The device technology determines whether the present invention is to be applied to avoid and suppress generation of a SET in the NMOS transistor or the PMOS transistor. In addition, the device technology also determines whether or not the present invention is to be applied to avoid and suppress generation of a SET in both the NMOS transistor and the PMOS transistor.

In addition, the SRAM is taken as an example of the memory circuit section. However, a memory with another data holding type can also be taken as an example of the memory circuit section.

In accordance with the first to third embodiments described before and the above modified versions, especially in the case of a combinational logic circuit, the tolerance for soft errors is dramatically improved.

As an alternative application, the present invention can be adopted as a substitute for a countermeasure adopted in a product so as to make a circuit device of the product simpler. As a result, it is possible to substantially reduce the cost of the countermeasure adopted by the product to serve as a countermeasure against soft errors.

In particular, in the case of a buffer circuit for relaying signals such as clock and clear signals, a generated SET immediately results in an error. Thus, to such a buffer circuit, the application of the present invention has an important meaning.

The present application contains subject matter related to that disclosed in Japanese Priority Patent Application JP 2009-012949 filed in the Japan Patent Office on Jan. 23, 2009, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:
1. A semiconductor integrated circuit comprising:
a memory circuit section used for storing data; and a non-memory circuit section which is provided to serve as a section other than said memory circuit section and used for storing no data, wherein the second-conduction-type impurity concentration of a second-conduction-type semiconductor area including a channel created for a first-conduction-type transistor employed in said non-memory circuit section is lower than the second-conduction-type impurity concentration of a second-conduction-type semiconductor area including a channel created for a first-conduction-type transistor employed in said memory circuit section, wherein said non-memory circuit section includes:

a combinational logic circuit having an output logic value determined by a combination of input logic values of said combinational logic circuit; and a sequential logic circuit having an output logic value determined by changes exhibited by an input logic value of said sequential logic circuit as changes along the time axis, and the second-conduction-type impurity concentration of a second-conduction-type semiconductor area including a channel created for a first-conduction-type transistor employed in said combinational logic circuit is lower than the second-conduction-type impurity concentration of said second-conduction-type semiconductor area including a channel created for a first-conduction-type transistor employed in said memory circuit section and lower than the second-conduction-type impurity concentration of a second-conduction-type semiconductor area including a channel created for a first-conduction-type transistor employed in said sequential logic circuit.

2. The semiconductor integrated circuit according to claim 1 wherein said non-memory circuit section includes:

a flip-flop circuit having an output logic value determined by changes exhibited by an input logic value of said flip-flop circuit as changes along the time axis; and a clock generating circuit configured to supply a clock signal to said flip-flop circuit, and the second-conduction-type impurity concentration of a second-conduction-type semiconductor area including a channel created for a first-conduction-type transistor employed in said clock generating circuit is lower than the second-conduction-type impurity concentration of said second-conduction-type semiconductor area including a channel created for a first-conduction-type transistor employed in said memory circuit section and lower than the second-conduction-type impurity concentration of a second-conduction-type semiconductor area including a channel created for a first-conduction-type transistor employed in said flip-flop circuit.

3. The semiconductor integrated circuit according to claim 2 wherein:

said clock generating circuit has a buffer circuit configured to form the waveform of said clock pulse; and the second-conduction-type impurity concentration of a second-conduction-type semiconductor area including a channel created for a first-conduction-type transistor employed in at least said buffer circuit among circuits included in said clock generating circuit is lower than the second-conduction-type impurity concentration of said second-conduction-type semiconductor area including a channel created for a first-conduction-type transistor employed in said memory circuit section and lower than the second-conduction-type impurity concentration of a second-conduction-type semiconductor area including a channel created for a first-conduction-type transistor employed in said flip-flop circuit.

4. The semiconductor integrated circuit according to claim 2 wherein:

said non-memory circuit further has a control-signal generating circuit configured to supply at least one of a clear signal and a preset signal to said flip-flop circuit; and the second-conduction-type impurity concentration of a second-conduction-type semiconductor area including a channel created for a first-conduction-type transistor employed in said clock generating circuit and the second-conduction-type impurity concentration of a second-conduction-type semiconductor area including a channel created for a first-conduction-type transistor employed in said control-signal generating circuit are lower than the second-conduction-type impurity concentration of said second-conduction-type semiconductor area including a channel created for a first-conduction-type transistor employed in said memory circuit section and lower than the second-conduction-type impurity concentration of a second-conduction-type semiconductor area including a channel created for a first-conduction-type transistor employed in said flip-flop circuit.

5. The semiconductor integrated circuit according to claim 4 wherein:

said control-signal generating circuit has a buffer circuit configured to form the waveform of said clear signal and the waveform of said preset signal; and the second-conduction-type impurity concentration of a second-conduction-type semiconductor area including a channel created for a first-conduction-type transistor employed in at least said buffer circuits among circuits included in said control-signal generating circuit are lower than the second-conduction-type impurity concentration of said second-conduction-type semiconductor area including a channel created for a first-conduction-type transistor employed in said memory circuit section and lower than the second-conduction-type impurity concentration of a second-conduction-type semiconductor area including a channel created for a first-conduction-type transistor employed in said flip-flop circuit.

6. A semiconductor integrated circuit comprising:

a memory circuit section used for storing data; and a non-memory circuit section which is provided to serve as a section other than said memory circuit section and used for storing no data, wherein the second-conduction-type impurity concentration of a second-conduction-type semiconductor area including a channel created for a first-conduction-type transistor employed in said non-memory circuit section is lower than the second-conduction-type impurity concentration of a second-conduction-type semiconductor area including a channel created for a first-conduction-type transistor employed in said memory circuit section, wherein said non-memory circuit section includes:

a flip-flop circuit having an output logic value determined by changes exhibited by an input logic value of said flip-flop circuit as changes along the time axis; and a control-signal generating circuit configured to supply at least one or a clear signal and a preset signal to said flip-flop circuit, and the second-conduction-type impurity concentration of a second-conduction-type semiconductor area including a channel created for a first-conduction-type transistor employed in said control-signal generating circuit is lower than the second-conduction-type impurity concentration of said second-conduction-type semiconductor area including a channel created for a first-conduction-type transistor employed in said memory circuit section and lower than the second-conduction-type impurity concentration of a second-conduction-type semiconductor area including a channel created for a first-conduction-type transistor employed in said flip-flop circuit.

7. The semiconductor integrated circuit according to claim 6 wherein:
said control-signal generating circuit has a buffer circuit configured to form the waveform of said clear signal and the waveform of said preset signal; and
the second-conduction-type impurity concentration of a second-conduction-type semiconductor area including a channel created for a first-conduction-type transistor employed in at least said buffer circuits among circuits included in said control-signal generating circuit are lower than the second-conduction-type impurity concentration of said second-conduction-type semiconductor area including a channel created for a first-conduction-type transistor employed in said memory circuit section and lower than the second-conduction-type impurity concentration of a second-conduction-type semiconductor area including a channel created for a first-conduction-type transistor employed in said flip-flop circuit.

8. A semiconductor integrated circuit comprising:
a memory circuit section used for storing data; and
a non-memory circuit section which is provided to serve as a section other than said memory circuit section and used for storing no data,
wherein the second-conduction-type impurity concentration of a second-conduction-type semiconductor area including a channel created for a first-conduction-type transistor employed in said non-memory circuit section is lower than the second-conduction-type impurity concentration of a second-conduction-type semiconductor area including a channel created for a first-conduction-type transistor employed in said memory circuit section,
wherein said second-conduction-type semiconductor area including a channel created for a first-conduction-type transistor employed in said memory circuit section is a first well;
said second-conduction-type semiconductor area including a channel created for a first-conduction-type transistor employed in said non-memory circuit section is a second well; and
the second-conduction-type impurity concentration of said second well is lower than the second-conduction-type impurity concentration of said first well.

9. A semiconductor integrated circuit comprising:
a memory circuit section used for storing data; and
a non-memory circuit section which is provided to serve as a section other than said memory circuit section and used for storing no data,
wherein the second-conduction-type impurity concentration of a second-conduction-type semiconductor area including a channel created for a first-conduction-type transistor employed in said non-memory circuit section is lower than the second-conduction-type impurity concentration of a second-conduction-type semiconductor area including a channel created for a first-conduction-type transistor employed in said memory circuit section,
wherein each of said second-conduction-type semiconductor area including a channel created for a first-conduction-type transistor employed in said memory circuit section and said second-conduction-type semiconductor area including a channel created for a first-conduction-type transistor employed in said non-memory circuit section is a second-conduction-type well;
a portion serving as said channel in said second-conduction-type well used as said second-conduction-type semiconductor area including said channel created for a first-conduction-type transistor employed in said non-memory circuit section is counter-doped with first-conduction-type impurities; and
said second-conduction-type well used as said second-conduction-type semiconductor area including said channel created for a first-conduction-type transistor employed in said memory circuit section is not counter-doped.

* * * * *